United States Patent
Hong

(10) Patent No.: US 11,269,556 B2
(45) Date of Patent: Mar. 8, 2022

(54) SEMICONDUCTOR MEMORY DEVICE AND MEMORY CONTROLLER HAVING RANDOMIZER

(71) Applicant: SK hynix Inc., Icheon-si (KR)

(72) Inventor: Jiman Hong, Seongnam-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 16/909,348

(22) Filed: Jun. 23, 2020

(65) Prior Publication Data

US 2021/0191656 A1 Jun. 24, 2021

(30) Foreign Application Priority Data

Dec. 18, 2019 (KR) .................. 10-2019-0170013

(51) Int. Cl.
| | |
|---|---|
| *G06F 3/00* | (2006.01) |
| *G06F 3/06* | (2006.01) |
| *G11C 16/10* | (2006.01) |
| *H03K 3/84* | (2006.01) |
| *G11C 16/04* | (2006.01) |

(Continued)

(52) U.S. Cl.
CPC .......... *G06F 3/0659* (2013.01); *G06F 3/0604* (2013.01); *G06F 3/0679* (2013.01); *G06F 7/582* (2013.01); *G11C 16/0483* (2013.01); *G11C 16/10* (2013.01); *G11C 16/26* (2013.01); *H03K 3/84* (2013.01)

(58) Field of Classification Search
CPC . G11C 16/20; G11C 16/3418; G11C 16/0483; G11C 16/26; G11C 11/5642; G11C 7/1006; G11C 11/00; G11C 11/5628; G11C 16/08; G11C 16/22; G11C 16/30; G11C 16/3454; G11C 16/3459; G11C 16/349; G11C 2211/5646; G11C 29/52; G11C 11/5621; G06F 3/0679; G06F 11/1012; G06F 12/0246; G06F 3/0619; G06F 3/0659; G06F 7/582; G06F 11/1008; G06F 11/108; G06F 12/00; G06F 12/0238; G06F 12/14; G06F 12/1408; G06F 21/00; G06F 2212/1032
USPC ......... 711/103, E12.008, 154, 156, E12.001, 711/E12.092, 114, 144, 145, 155, 157, 711/173; 365/185.18, 185.17, 185.24
See application file for complete search history.

(56) References Cited

U.S. PATENT DOCUMENTS

2012/0287719 A1* 11/2012 Mun .................. G11C 16/3418
365/185.18

FOREIGN PATENT DOCUMENTS

| KR | 1020140124596 A | 10/2014 |
|---|---|---|
| KR | 101818445 B1 | 1/2018 |

* cited by examiner

*Primary Examiner* — Thong Q Le
(74) *Attorney, Agent, or Firm* — William Park & Associates Ltd.

(57) ABSTRACT

A memory controller for controlling an operation of a semiconductor memory device including a memory block including a plurality of sub-blocks. The memory controller includes a randomizer. The randomizer includes: seed table storage configured to store a plurality of seed tables respectively corresponding to the plurality of sub-blocks, and to generate a seed, based on sub-block information of received original data; a random sequence generator configured to generate a random sequence, based on the seed generated by the seed table storage; and an operating component configured to generate random data, based on the random sequence and the original data.

20 Claims, 20 Drawing Sheets

(51) Int. Cl.
*G11C 16/26* (2006.01)
*G06F 7/58* (2006.01)

FIG. 9

| PI | SEED |
|---|---|
| PAGE11 | SD_1 |
| PAGE21 | SD_2 |
| PAGE12 | SD_3 |
| PAGE22 | SD_4 |
| PAGE13 | SD_5 |
| PAGE23 | SD_6 |
| ... | ... |
| PAGE1n | SD_(2n-1) |
| PAGE2n | SD_2n |

|       | CS11  | CS12 |
|-------|-------|------|
| WL1   | 1     | 0    |
| WL2   | 1     | 1    |
| WL3   | 1     | 0    |
| WL4   | 1     | 0    |
| WL5   | 0     | 0    |
| WL6   | 1     | 0    |
| WL7   | 1     | 1    |
| WL8   | 1     | 0    |
| AVERAGE VALUE | 0.875 | 0.25 |

FIG. 12A

| PI | SEED |
|---|---|
| PAGE11 | SD_11 |
| PAGE12 | SD_12 |
| PAGE13 | SD_13 |
| PAGE14 | SD_14 |
| ... | ... |
| PAGE1n | SD_1n |

FIG. 12B

| PI | SEED |
|---|---|
| PAGE21 | SD_21 |
| PAGE22 | SD_22 |
| PAGE23 | SD_23 |
| PAGE24 | SD_24 |
| ... | ... |
| PAGE2n | SD_2n |

FIG. 13

|  | CS11 | CS12 |
|---|---|---|
| WL1 | 1 | 0 |
| WL2 | 0 | 0 |
| WL3 | 1 | 1 |
| WL4 | 1 | 0 |
| WL5 | 0 | 1 |
| WL6 | 0 | 1 |
| WL7 | 1 | 0 |
| WL8 | 0 | 1 |
| AVERAGE VALUE | 0.5 | 0.5 |

SEMICONDUCTOR MEMORY DEVICE AND MEMORY CONTROLLER HAVING RANDOMIZER

CROSS-REFERENCE TO RELATED APPLICATION

The present application claims priority under 35 U.S.C. § 119(a) to Korean patent application number 10-2019-0170013, filed on Dec. 18, 2019, in the Korean Intellectual Property Office, the entire disclosure of which is incorporated herein by reference.

BACKGROUND

1. Technical Field

The present disclosure generally relates to an electronic device, and more particularly, to a semiconductor memory device and a memory controller having a randomizer.

2. Related Art

Memory devices may be formed in a two-dimensional structure in which strings are arranged horizontally to a semiconductor substrate, or be formed in a three-dimensional structure in which strings are arranged vertically to a semiconductor substrate. Three-dimensional memory devices are memory devices devised so as to overcome the limit of degree of integration of two-dimensional memory devices, and may include a plurality of memory cells vertically stacked on a semiconductor substrate.

SUMMARY

In accordance with an aspect of the present disclosure, a memory controller for controlling an operation of a semiconductor memory device includes a randomizer. The semiconductor memory device includes a memory block including a plurality of sub-blocks. The randomizer includes: seed table storage configured to store a plurality of seed tables respectively corresponding to the plurality of sub-blocks, and to generate a seed, based on sub-block information of received original data; a random sequence generator configured to generate a random sequence, based on the seed generated by the seed table storage; and an operating component configured to generate random data, based on the random sequence and the original data.

In accordance with another aspect of the present disclosure, a semiconductor memory device includes: a memory block including a plurality of sub-blocks; a read/write circuit configured to perform a read operation and a write operation of data on the memory block; and a randomizer configured to receive original data, and to randomize the received data and then transfer the randomized data to the read/write circuit. The randomizer includes: seed table storage configured to store a plurality of seed tables respectively corresponding to the plurality of sub-blocks, and to generate a seed, based on sub-block information of the original data; a random sequence generator configured to generate a random sequence, based on the seed generated by the seed table storage; and an operating component configured to generate random data, based on the random sequence and the original data.

In accordance with still another aspect of the present disclosure, a method for randomizing data to be stored in a memory block including a plurality of sub-blocks includes: receiving original data; selecting any one of a plurality of seed tables, based on sub-block information on a sub-block in which the original data is to be stored; selecting any one of a plurality of seeds included in the selected seed table, based on a page address of the original data; and generating random data by randomizing the original data, based on the selected seed.

In accordance with still another aspect of the present disclosure, a memory system includes a semiconductor memory device including a memory block including a plurality of sub-blocks and a memory controller configured to control an operation of the semiconductor memory device. The memory system is configured to: generate a randomizing seed, based on a seed table corresponding to sub-block information of original data received from outside the memory system, among a plurality of seed tables respectively corresponding to the plurality of sub-blocks; generate random data, based on the randomizing seed and the original data; and store the random data in a sub-block corresponding to the sub-block information.

BRIEF DESCRIPTION OF THE DRAWINGS

Example embodiments will now be described hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it might be the only element between the two elements, or one or more intervening elements may also be present. Like reference numerals refer to like elements throughout.

FIG. 9 is a diagram illustrating a seed table in accordance with an embodiment of the present disclosure.

FIGS. 12A and 12B are diagrams illustrating seed tables stored in the seed table storage shown in FIG. 11.

FIG. 13 is a table illustrating a result obtained by randomizing data, using the seed tables shown in FIGS. 12A and 12B.

DETAILED DESCRIPTION

Figure 1:
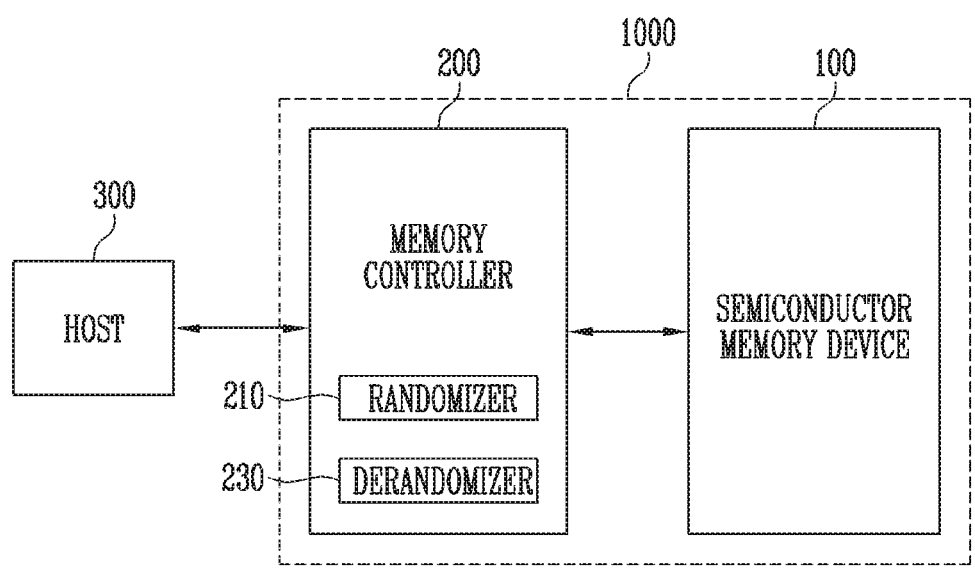
FIG. 1 is a block diagram illustrating a memory system including a memory controller and a semiconductor memory device.

In the present disclosure, advantages, features, and methods for achieving them will be more apparent after reading of following embodiments taken in conjunction with the drawings. The present disclosure may, however, be embodied in different forms and should not be construed as being limited to the embodiments set forth herein, Rather, these embodiments are provided to describe the present disclosure in detail to the extent that those skilled in the art to which the disclosure pertains may enforce the technical concept of the present disclosure.

In the specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Hereinafter, embodiments of the present disclosure will be described in detail with reference to the accompanying drawings. The same reference numerals are used to designate the same elements as those shown in other drawings. In the following descriptions, only portions necessary for understanding operations in accordance with the embodiments may be described, and descriptions of the other portions may be omitted so as to not obscure important concepts of the embodiments.

Various embodiments provide a semiconductor memory device and a memory controller having a randomizer capable of improving the randomness of data.

FIG. 1 is a block diagram illustrating a memory system 1000 including a memory controller 200 and a semiconductor memory device 100, in accordance with embodiments of the present disclosure.

Referring to FIG. 1, the memory system 1000 may include the semiconductor memory device 100 and the memory controller 200. The semiconductor memory device 100 may include a memory cell array 110 (see FIG. 2).

Figure 2:
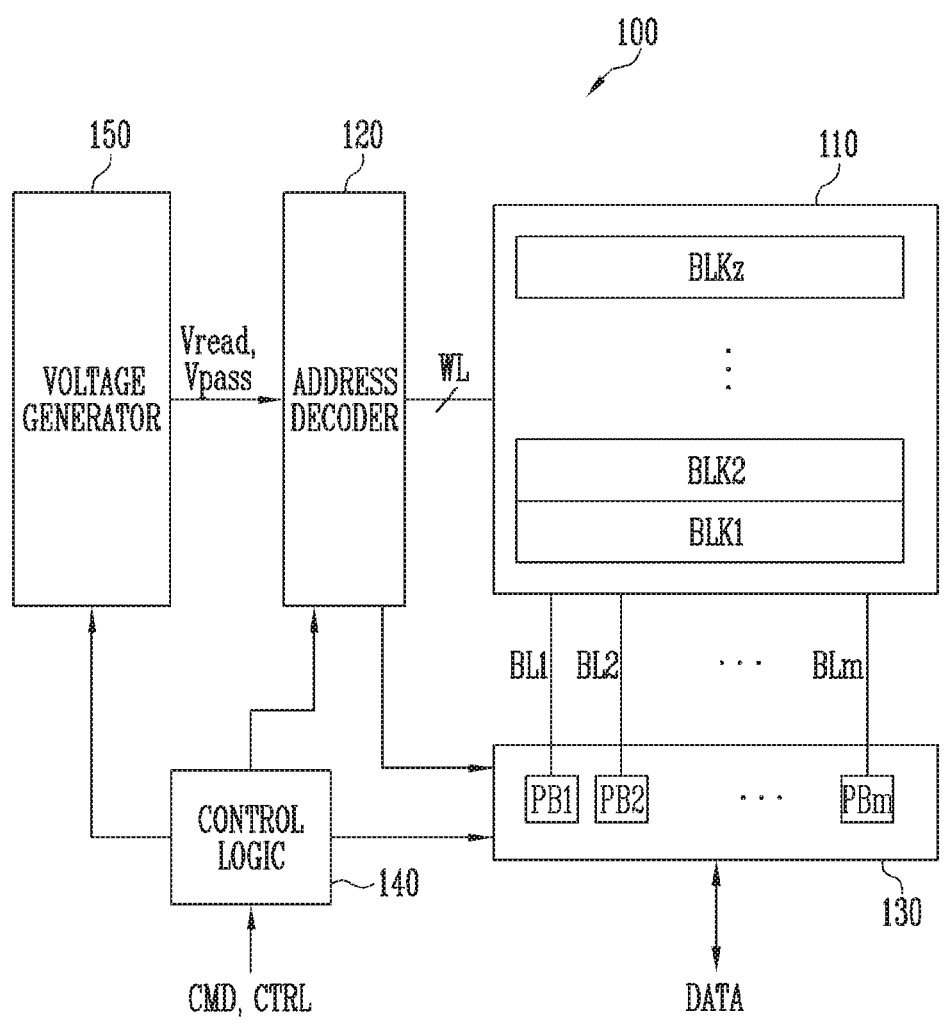
FIG. 2 is a block diagram illustrating the semiconductor memory device shown in FIG. 1.

The memory cell array 110 includes a plurality of memory regions. The plurality of memory regions may be a plurality of memory blocks BLK1 to BLKz as shown in FIG. 2. Each memory block forms an erase unit. Each of the plurality of memory blocks BLK1 to BLKz includes a plurality of memory cells.

The semiconductor memory device 100 operates under the control of the memory controller 200.

The semiconductor memory device 100 writes data in the memory cell array 110 in response to a write request from the memory controller 200. When a write command, an address, and data are received as the write request from the memory controller 200, the semiconductor memory device 100 writes the data in memory cells indicated by the address.

The semiconductor memory device 100 performs a read operation in response to a read request from the memory controller 200. When a read command and an address are received as the read request from the memory controller 200, the semiconductor memory device 100 reads data of memory cells indicated by the address, and outputs the read data to the memory controller 200.

In an embodiment, the semiconductor memory device 100 may be a flash memory device. However, it will be understood that the technical concept of the present disclosure is not limited to the flash memory device. In some embodiments, the semiconductor memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like.

In an embodiment, the semiconductor memory device 100 may be implemented in a two-dimensional array structure or three-dimensional array structure. The present disclosure may be applied to not only a flash memory device in which a charge storage layer is configured with a Floating Gate (FG) but also a Charge Trap Flash (CTF) in which a charge storage layer is configured with an insulating layer.

The memory controller 200 is coupled between the semiconductor memory device 100 and a host 300. The memory controller 200 interfaces the host 300 and the semiconductor memory device 100. The memory controller 200 may transmit a write request or a read request to the semiconductor memory device 100 under the control of the host 300.

The memory controller 200 may include a randomizer 210 and a derandomizer 230. The randomizer 210 may be activated in a write operation. When a block address of a memory block to be written is provided to the randomizer 210, the randomizer 210 may generate a randomizing seed corresponding to the corresponding memory block. That is, the randomizer 210 generates a randomizing seed corresponding to the memory block to be written among randomizing seeds corresponding to the plurality of memory blocks BLK1 to BLKz. In an embodiment, the randomizing seed may be generated from a seed table. In another embodiment, the randomizing seed may be generated using a numerical algorithm. Subsequently, the randomizer 210 performs an operation on data received from the host 300 and the generated randomizing seed, and writes the randomized data generated by the operation to the corresponding memory block. Data on which an operation has been performed based on a randomizing seed is written to the memory cell array 110, so that a threshold voltage distribution of the memory cells in the memory cell array 110 can be improved, and the reliability of data stored in the memory cell can be improved.

Meanwhile, the derandomizer 230 is activated in a read operation. The memory controller 200 reads data from the semiconductor memory device 100 in the read operation. In addition, a derandomizing seed corresponding to a memory block from which the data is read is generated. That is, when a block address of the memory block from which the data is read is provided to the derandomizer 230, the derandomizer 230 may generate a derandomizing seed corresponding to the corresponding memory block. In other words, the derandomizer 230 generates a derandomizing seed corresponding to the memory block from which the data is read among derandomizing seeds corresponding to the plurality of memory blocks BLK1 to BLKz. In an embodiment, the derandomizing seed may be generated from the seed table.

Subsequently, the derandomizer 230 may perform an operation on the read data and the generated derandomizing seed. Data derandomized by the operation may be transmitted to the host 300.

According to the memory controller in accordance with the embodiment of the present disclosure, when data is randomized, original data is randomized by selecting a seed table, based on sub-block information on a sub-block in which original data is to be stored, and generating a seed according to the selected seed table. Thus, when data to be stored in a memory block including a plurality of sub-blocks is randomized, data to be stored in each sub-block is randomized independently from that to be stored in another sub-block. Accordingly, the randomness of the randomized data in a string direction (+Z direction) can be improved.

FIG. 2 is a block diagram illustrating the semiconductor memory device 100 shown in FIG. 1.

Referring to FIG. 2, the semiconductor memory device 100 may include a memory cell array 110, an address decoder 120, a read/write circuit 130, control logic 140, and a voltage generator 150.

The memory cell array 110 includes a plurality of memory blocks BLK1 to BLKz. The plurality of memory blocks BLK1 to BLKz are coupled to the address decoder 120 through word lines WL. The plurality of memory blocks BLK1 to BLKz are coupled to the read/write circuit 130 through bit lines BL1 to BLm. Each of the plurality of memory blocks BLK1 to BLKz includes a plurality of memory cells. In an embodiment, the plurality of memory cells may be nonvolatile memory cells, and be configured with nonvolatile memory cells having a vertical channel structure. The memory cell array 110 may be configured as a memory cell array having a two-dimensional structure. In some embodiments, the memory cell array 110 may be configured as a memory cell array having a three-dimensional structure. Meanwhile, each of the plurality of memory cells included in the memory cell array 110 may store at least 1-bit data. In an embodiment, each of plurality of the memory cells included in the memory cell array 110 may be a single-level cell (SLC) storing 1-bit data. In another embodiment, each of the plurality of memory cells included in the memory cell array 110 may be a multi-level cell (MLC) storing 2-bit data. In still another embodiment, each of the plurality of memory cells included in the memory cell array 110 may be a triple-level cell (TLC) storing 3-bit data. In still another embodiment, each of the plurality of memory cells included in the memory cell array 110 may be a quadruple-level cell (QLC) storing 4-bit data. In some embodiments, the memory cell array 110 may include a plurality of memory cells each storing 5-or-more bit data.

The address decoder 120, the read/write circuit 130, the control logic 140, and the voltage generator 150 operate as a peripheral circuit for driving the memory cell array 110. The address decoder 120 is coupled to the memory cell array 110 through the word lines WL. The address decoder 120 operates under the control of the control logic 140. The address decoder 120 receives an address through an input/output buffer (not shown) in the semiconductor memory device 100.

The address decoder 120 decodes a block address among received addresses. The address decoder 120 selects at least one memory block according to the decoded block address. Also, in a read voltage application operation during a read operation, the address decoder 120 applies a read voltage Vread generated by the voltage generator 150 to a selected word line of the selected memory block, and applies a pass voltage Vpass generated by the voltage generator 150 to the other unselected word lines. Also, in a program verify operation, the address decoder 120 applies a verify voltage generated by the voltage generator 150 to the selected word line of the selected memory block, and applies the pass voltage Vpass to the other unselected word lines.

The address decoder 120 decodes a column address among the received addresses. The address decoder 120 transmits the decoded column address to the read/write circuit 130.

Read and program operations of the semiconductor memory device 100 are performed in a unit of a page. Addresses received in a request for the read and program operations include a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 includes a plurality of page buffers PB1 to PBm. The read/write circuit 130 may operate as a "read circuit" in a read operation, and operate as a "write circuit" in a write operation. The plurality of page buffers PB1 to PBm are coupled to the memory cell array 110 through the bit lines BL1 to BLm. In order to sense threshold voltages of the memory cells in a read operation or a program verify operation, the plurality of page buffers PB1 to PBm supply sensing current to the bit lines coupled to the memory cells, and each page buffer senses, through a sensing node, a change in the amount of current flowing depending on a program state of a corresponding memory cell and then latches the sensed change as sensing data. The read/write circuit 130 operates in response to page buffer control signals output from the control logic 140.

In a read operation, the read/write circuit 130 senses data of the memory cells and temporarily stores read data, and then outputs data DATA to the input/output buffer (not shown) of the semiconductor memory device 100. In an embodiment, the read/write circuit 130 may include a column select circuit and the like as well as the page buffers (or page registers).

The control logic 140 is coupled to the address decoder 120, the read/write circuit 130, and the voltage generator 150. The control logic 140 receives a command CMD and a control signal CTRL though the input/output buffer (not shown) of the semiconductor memory device 100. The control logic 140 controls a general operation of the semiconductor memory device 100 in response to the control signal CTRL. Also, the control logic 140 outputs a control signal for adjusting a sensing node precharge potential levels of the plurality of page buffers PB1 to PBm. The control logic 140 may control the read/write circuit 130 to perform a read operation of the memory cell array 110. The control logic 140 may be implemented as hardware, software, or a combination of hardware and software. For example, the control logic 140 may be a control logic circuit operating in accordance with an algorithm and/or a processor executing control logic code.

The voltage generator 150 generates a read voltage Vread and a pass voltage Vpass in a read operation in response to a control signal output from the control logic 140. In order to generate a plurality of voltages having various voltage levels, the voltage generator 150 may include a plurality of pumping capacitors for receiving an internal power voltage, and generate the plurality of voltages by selectively activating the plurality of pumping capacitors under the control of the control logic 140.

The address decoder 120, the read/write circuit 130, and the voltage generator 150 may serve as a "peripheral circuit" for performing a read operation, a write operation, and an erase operation on the memory cell array 110. The peripheral circuit performs the read operation, the write operation, and the erase operation on the memory cell array 110 under the control of the control logic 140.

Figure 3:
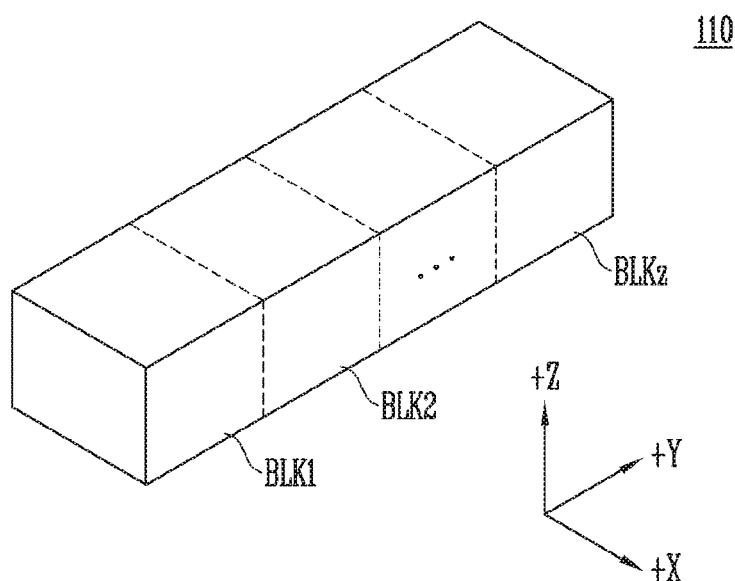
FIG. 3 is a diagram illustrating an embodiment of a memory cell array shown in FIG. 2.

FIG. 3 is a diagram illustrating an embodiment of the memory cell array 110 shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

Figure 4:
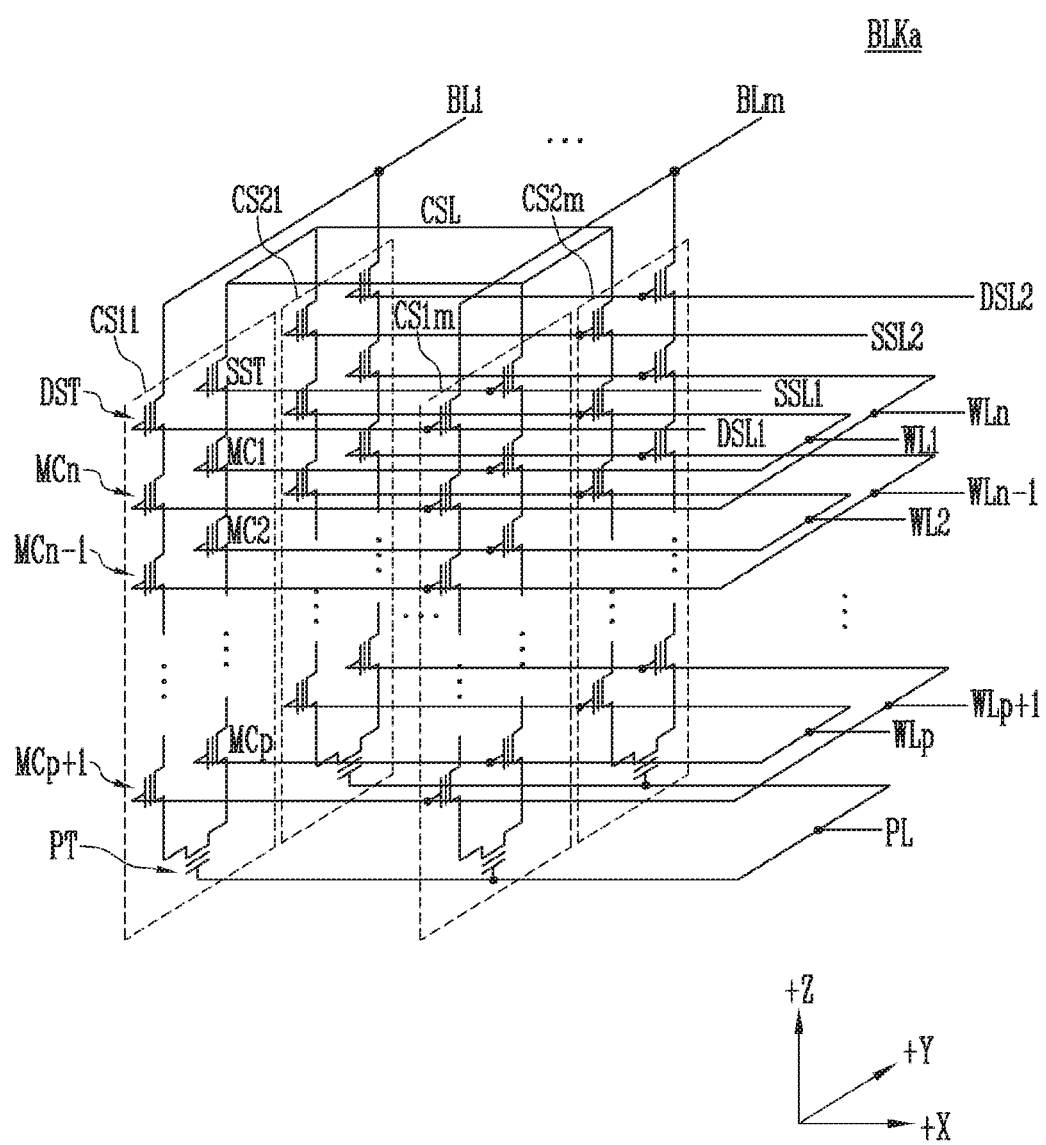
FIG. 4 is a circuit diagram illustrating one memory block among the memory blocks shown in FIG. 3.

FIG. 4 is a circuit diagram illustrating one memory block BLKa among the memory blocks BLK1 to BLKz shown in FIG. 3.

Referring to FIG. 4, the memory block BLKa may include a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the memory block BLKa, m cell strings are arranged in a row direction (i.e., a +X direction). In FIG. 4, there is illustrated a case where two cell strings arranged in a column direction (i.e., a +Y direction) are arranged. However, this is for convenience of description, and it will be understood that three cell strings may be arranged in the column direction.

Each of the plurality of cell strings CS11 to CS1$m$ and CS21 to CS2$m$ may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1$m$ on a first row are coupled to a first source select line SSL1. The source select transistors of the cell strings CS21 to CS2$m$ on a second row are coupled to a second source select line SSL2.

In another embodiment, the source select transistors of the cell strings CS11 to CS1$m$ and CS21 to CS2$m$ may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn, Cell strings arranged in the row direction are coupled to a drain select line extending in the row direction. The drain select transistors of the cell strings CS11 to CS1$m$ on the first row are coupled to a first drain select line DSL1. The drain select transistors of the cell strings CS21 to CS2$m$ on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1$m$ and CS2$m$ on an mth column are coupled to an mth bit line BLm.

Memory cells coupled to the same word line in the cell strings arranged in the row direction constitute one page. For example, memory cells coupled to the first word line WL1 in the cell strings CS11 to CS1$m$ on the first row constitute one page. Memory cells coupled to the first word line WL1 in the cell strings CS21 to CS2$m$ on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1$m$ or CS21 to CS2$m$ arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage.

Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 5:
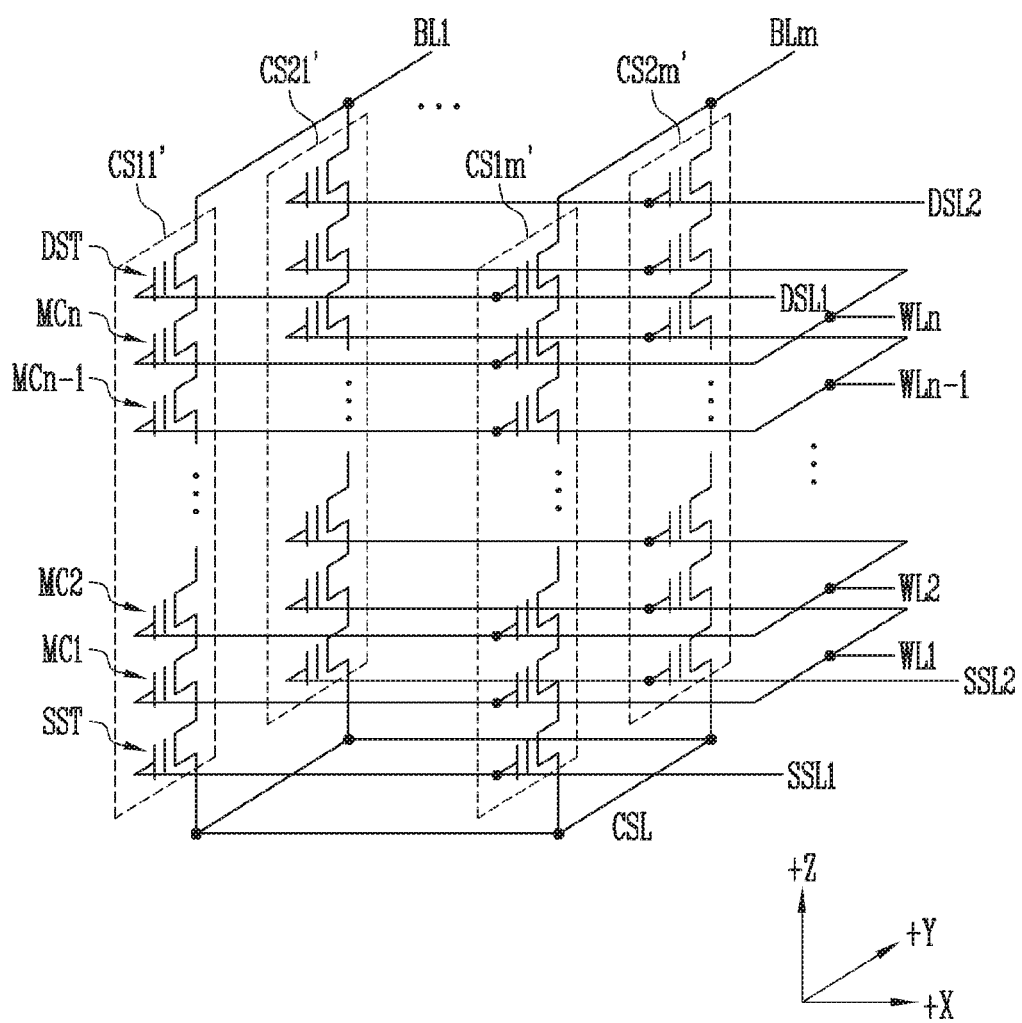
FIG. 5 is a circuit diagram illustrating another embodiment of the one memory block among the memory blocks shown in FIG. 3.

FIG. 5 is a circuit diagram illustrating another embodiment BLKb of the one memory block among the memory blocks BLK1 to BLKz shown in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 6:
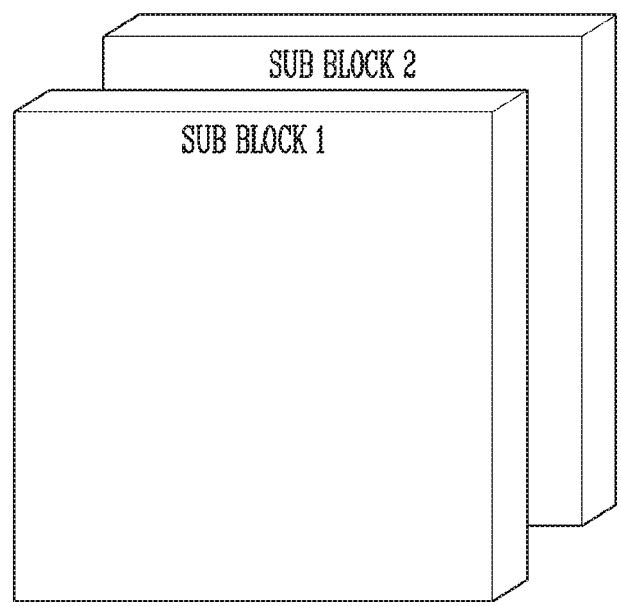
FIG. 6 is a diagram illustrating sub-blocks constituting a memory block.
Figure 6:
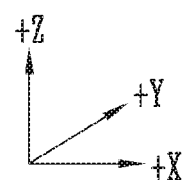

FIG. 6 is a diagram illustrating an example of sub-blocks constituting a memory block.

Referring to FIG. 6, sub-blocks SUB BLOCK 1 and SUB BLOCK 2 included in the memory block BLKa or BLKb shown in FIG. 4 or 5 are illustrated. In an example, referring to FIG. 6 together with FIG. 4, a sub-block included in the memory block BLKa may be defined as cell strings sharing a drain select line or a source select line. For example, in FIG. 4, the cell strings CS11 to CS1m sharing the first drain select line DSL1 and the first source select line SSL1 may constitute a first sub-block SUB BLOCK 1. Meanwhile, the cell strings CS21 to CS2m sharing the second drain select line DSL2 and the second source select line SSL2 may constitute a second sub-block SUB BLOCK 2.

In another example, in FIG. 5, the cell strings CS11' to CS1m' sharing the first drain select line DSL1 and the first source select line SSL1 may constitute the first sub-block SUB BLOCK 1. Meanwhile, the cell strings CS21' to CS2m' sharing the second drain select line DSL2 and the second source select line SSL2 may constitute the second sub-block SUB BLOCK 2. The memory block includes two sub-blocks SUB BLOCK 1 and SUB BLOCK 2 disposed in a +Y direction. Each of the sub-blocks SUB BLOCK 1 and SUB BLOCK 2 includes cell strings arranged in a row direction (i.e., a +X direction). Meanwhile, the sub-blocks SUB BLOCK 1 and SUB BLOCK 2 respectively include pages arranged in a string direction (i.e., a +Z direction). A more detailed configuration of each sub-block will be described later with reference to FIG. 7.

Figure 7A:
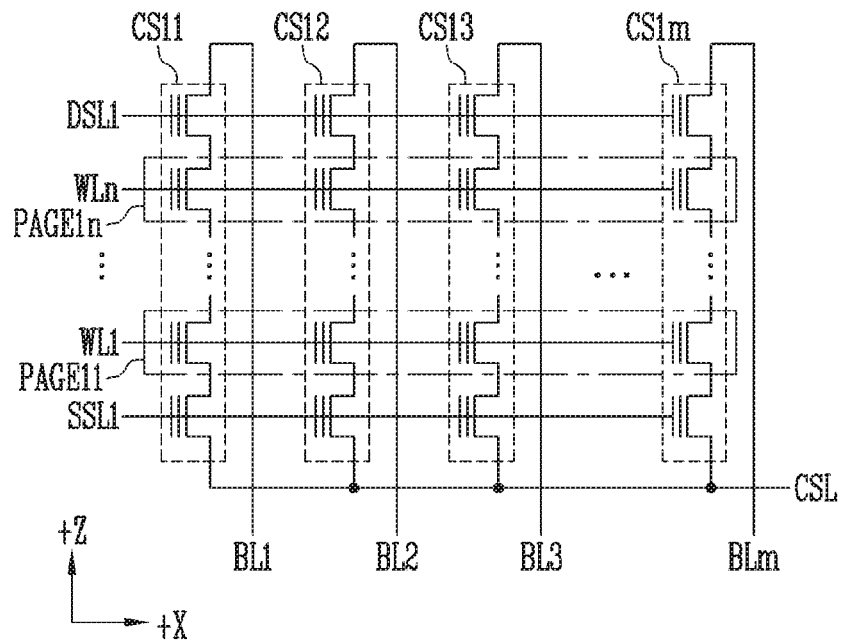
FIG. 7A is a circuit diagram illustrating in more detail a first sub-block among the sub-blocks shown in FIG. 6.

FIG. 7A is a circuit diagram illustrating in more detail the first sub-block SUB BLOCK 1 among the sub-blocks shown in FIG. 6. The second sub-block SUB BLOCK 2 may be configured identically to the first sub-block, and therefore, a detailed circuit diagram of the second sub-block will be omitted.

Referring to FIG. 7A, the first sub-block SUB BLOCK 1 includes cell strings CS11 to CS1$m$ sharing a first drain select line DSL1 and a first source select line SSL. The cell strings CS11 to CS1$m$ are arranged in the +X direction in the first sub-block SUB BLOCK 1. The cell strings CS11 to CS1$m$ are respectively coupled to corresponding bit lines BL1 to BLm.

Meanwhile, the first sub-block SUB BLOCK 1 includes pages PAGE11 to PAGE1$n$ arranged in the +Z direction. Each of the pages PAGE11 to PAGE1$n$ may be a set of memory cells coupled to a corresponding word line among word lines WL1 to WLn.

Although not shown in FIG. 7A, the second sub-block SUB BLOCK 2 may also include cell strings CS21 to CS2$m$ arranged in the +X direction. Meanwhile, the second sub-block SUB BLOCK 2 may include pages PAGE21 to PAGE2$n$ arranged in the +Z direction.

Figure 7B:
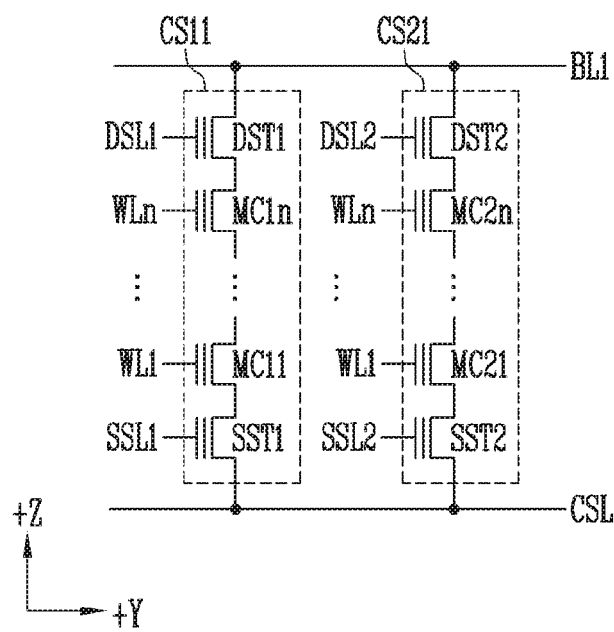
FIG. 7B is a circuit diagram illustrating some cell strings included in first and second sub-blocks.

FIG. 7B is a circuit diagram illustrating some of the cell strings included in first and second sub-blocks.

Referring to FIG. 7B, the cell string CS11 included in the first sub-block SUB BLOCK 1 and the cell string CS21 included in the second sub-block SUB BLOCK 2 are illustrated. FIG. 7B may be a circuit diagram illustrating the memory block shown in FIG. 6 in the +X direction. Therefore, the cell strings CS12 to CS1$m$ included in the first sub-block SUB BLOCK 1 and the cell strings CS22 to CS2$m$ included in the second sub-block SUB BLOCK 2 are not illustrated in FIG. 7B.

The cell string CS11 of the first sub-block SUB BLOCK 1 includes memory cells MC11 to MC1$n$ coupled between a first drain select transistor DST1 and a first source select transistor SST1. The cell string CS21 of the second sub-block SUB BLOCK 2 includes memory cells MC21 to MC2$n$ coupled between a second drain select transistor DST2 and a second source select transistor SST2.

Figure 8A:
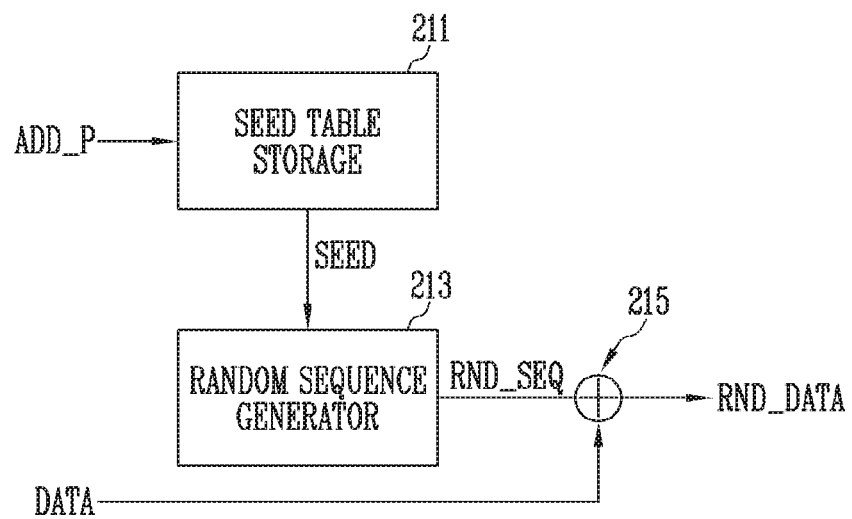
FIGS. 8A and 8B are block diagrams illustrating a randomizer and a derandomizer in accordance with embodiments of the present disclosure.
Figure 8B:
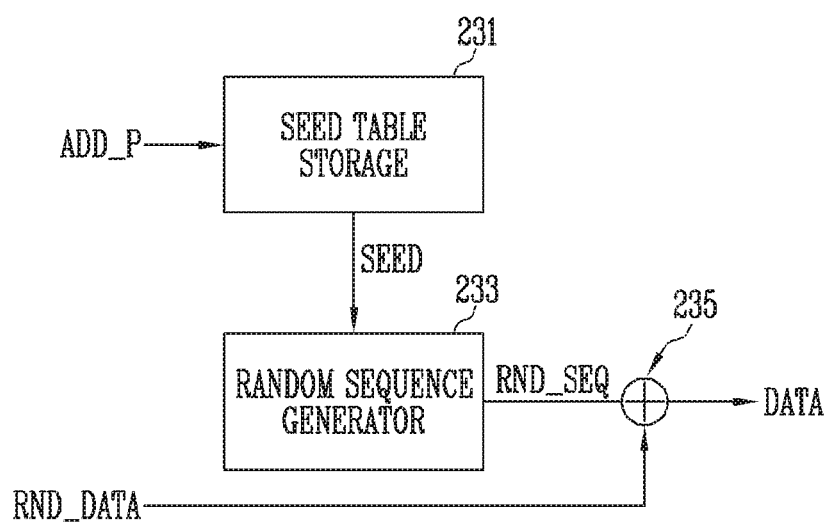

FIGS. 8A and 8B are block diagrams illustrating the randomizer 210 and the derandomizer 230, respectively, in accordance with embodiments of the present disclosure.

Referring to FIG. 8A, the randomizer 210 may include seed table storage 211, a random sequence generator 213, and an operating component 215.

The seed table storage 211 may store a seed table configured with seeds corresponding to addresses of data. The seed table storage 211 may receive a page address ADD_P at which data is to be stored, and output a seed SEED corresponding the page address ADD_P.

The random sequence generator 213 may generate a random sequence RND_SEQ, based on the received seed SEED. The operating component 215 merges the received random sequence RND_SEQ and data DATA. The data DATA may be original data. For example, the operating component 215 generates randomized data RND_DATA by performing an Exclusive-OR (XOR) operation on the random sequence RND_SEQ and the data DATA.

The random sequence generator 213 may be configured in various forms. In an embodiment, the random sequence generator 213 may be implemented as a Linear Feedback Shift Register (LFSR) including a shift register and an XOR operation unit. The random sequence generator 213 generates a random sequence RND_SEQ which is initialized to the received seed and then has a certain period in synchronization with a clock signal. The period of the random sequence RND_SEQ may be determined according to a number of sub-registers constituting the shift register. For example, when the number of sub-registers included in the random sequence generator 213 implemented as the LFSR is 10, the maximum period which the random sequence RND_SEQ can have may be $1023(=2^{10}-1)$. In another example, the random sequence generator 213 may be implemented as a Pseudo-Noise (PN) random sequence generator, a Cyclic Redundancy Check (CRC) generator, or the like.

The randomized data RND_DATA may be transferred to the semiconductor memory device 100 to be programmed.

Referring to FIG. 8B, the derandomizer 230 may include seed table storage 231, a random sequence generator 233, and an operating component 235.

The seed table storage 231 may store a seed table configured with seeds corresponding to addresses of data. The seed table storage 231 may receive a page address at which data is stored, and output a seed SEED corresponding to the page address ADD_P. Referring to FIGS. 8A and 8B together, the seed table storage 231 shown in FIG. 8B may be the same component as the seed table storage 211 shown in FIG. 8A.

The random sequence generator 233 may generate a random sequence RND_SEQ, based on the received seed SEED. The operating component 235 merges the received random sequence RND_SEQ and randomized data RND_DATA. The randomized data RND_DATA may be data read from the semiconductor memory device 100. For example, the operating component 235 may generate data DATA by performing an XOR operation on the random sequence RND_SEQ and the randomized data RND_DATA. The data DATA output from the operating component 235 may be original data generated by derandomizing the randomized data RND_DATA.

The random sequence generator 233 shown in FIG. 8B may be configured identically to the random sequence generator 213 shown in FIG. 8A. In an example, the random sequence generator 233 may be implemented as an LFSR, a PN random sequence generator, a CRC generator, or the like.

FIG. 9 is a diagram illustrating a seed table in accordance with an embodiment of the present disclosure. Referring to FIG. 9, page index PI corresponding to each of a plurality of pages included in a specific block and seed SEED corresponding to the corresponding page index are illustrated.

Referring to FIGS. 6 and 7A together, the first sub-block SUB BLOCK 1 includes a plurality of pages PAGE11 to PAGE1$n$, and the second sub-block SUB BLOCK 2 includes a plurality of pages PAGE21 to PAGE2$n$. The seed table shown in FIG. 9 includes a seed SD_1 corresponding to a first page PAGE11 of the first sub-block SUB BLOCK 1 and a seed SD_2 corresponding to a first page PAGE21 of the second sub-block SUB BLOCK 2. In this manner, the seed table shown in FIG. 9 sequentially includes seeds SD_1 to SD_2$n$ alternately corresponding to the pages included in the first sub-block SUB BLOCK 1 and the second sub-block SUB BLOCK 2.

Each of the seeds SD_1 to SD_2$n$ in the seed table may be generated to have a random relationship with adjacent seeds. This is for the purpose of improving the randomness of data in the string direction (+Z direction) in FIG. 6.

That is, the randomizing of the data DATA, which is performed in FIG. 8, is for the purpose of improving the randomness of data input in a unit of a page in the row direction (+X direction). In addition, when randomizing is performed based on the same seed, the randomness of data in the string direction (+Z direction) may be deteriorated, and therefore, the seeds SD_1 to SD_2n in the seed table are also determined to have random values.

However, when the memory block includes a plurality of sub-blocks, the randomness of data in the string direction (+Z direction) in each sub-block may be deteriorated. This will be described later with reference to FIG. 10.

Figures 10, 11:
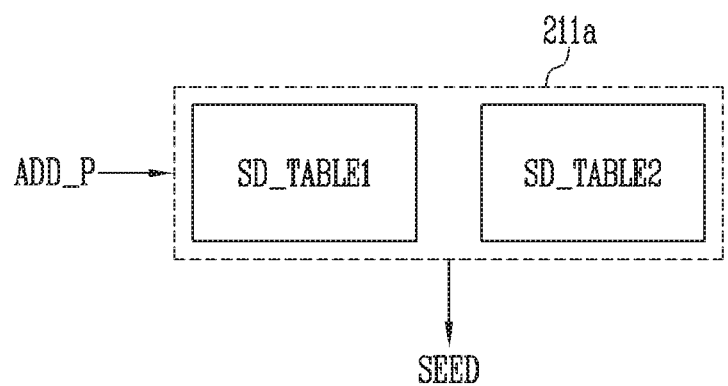
FIG. 10 is a table illustrating an example of a result obtained by randomizing data, using the seed table shown in FIG. 9.
FIG. 11 is a block diagram illustrating seed table storage in accordance with an embodiment of the present disclosure.

FIG. 10 is a table illustrating an example of a result obtained by randomizing data, using the seed table shown in FIG. 9.

Referring to FIG. 10, data values of memory cells included in the cell strings CS11 and CS21 shown in FIG. 7B are illustrated. In FIG. 10, a case where each memory cell is a Single Level Cell (SLC) storing 1-bit data is assumed. In the example shown in FIG. 10, a case where n is "8" is illustrated. That is, each of the cell strings CS11 and CS21 includes eight memory cells. Because the memory cells are respectively coupled to first to eighth word lines WL1 to WL8, a corresponding memory cell is designated as a word line index. For example, as a randomizing result, data to be stored in the memory cell MC11 coupled to the first word line WL1 among the memory cells included in the first sub-block SUB BLOCK 1 is "1" This may be a result by randomizing the page PAGE11 including the corresponding memory cell as the seed value SD_1 of the seed table shown in FIG. 9.

In addition, as a randomizing result, data to be stored in the memory cell MC21 coupled to the first word line WL1 among the memory cells included in the second sub-block SUB BLOCK 2 is "0." This may be a result by randomizing the page PAGE21 including the corresponding memory cell as the seed value SD_2 of the seed table shown in FIG. 9.

Referring to the table shown in FIG. 10, when randomized data of 16 memory cells MC11, MC21, MC12, MC22, MC13, MC23, MC14, MC24, MC15, MC25, MC16, MC26, MC17, MC27, MC18, and MC28 are sequentially written, the randomized data corresponds to "1011101000101110." This is a result of randomizing performed based on seeds SD_1 to SD16.

Meanwhile, when the randomizing result is compared for each sub-block, the cell string CS11 included in the first sub-block SUB BLOCK 1 includes a total of seven bits "1," and the cell string CS21 included in the second sub-block SUB BLOCK 2 includes a total of two bits "1." Accordingly, the average value of bits of the cell string CS11 included in the first sub-block SUB BLOCK 1 is 0.0875 (=7÷8), and the average value of bits of the cell string CS21 included in the second sub-block SUB BLOCK 2 is 0.25 (=2÷8). When the memory block includes a plurality of sub-blocks even though a seed table obtained by considering the string direction (+Z direction) is used, the randomness of data in the string direction (+Z direction) in a string included in each sub-block may be deteriorated. That is, data of the cell string CS11 included in the first sub-block SUB BLOCK 1 is randomized such that a relatively large number of bits "1" are included, and data of the cell string CS21 included in the second sub-block SUB BLOCK 2 is randomized such that a relatively large number of bits "0" are included.

Memory cells included in one cell string share a channel. Hence, when a deviation in data average value of each cell string is large as a randomizing result, this may have disadvantageous influence on the operational performance of the semiconductor memory device 100. In an example, when memory cells included in one cell string are programmed such that a relatively large number of bits "1" are included, an average threshold voltage of the memory cells of the corresponding cell string is low. On the other hand, when memory cells included in one cell string are programmed such that a relatively large number of bits "0" are included, an average threshold voltage of the memory cells of the corresponding cell string is high. This generates a deviation in operating characteristic between cell strings, which results in a decrease in the operational performance of the semiconductor memory device 100.

In accordance with the embodiment of the present disclosure, in randomizing of data, the memory controller randomize original data by selecting a seed table, based on sub-block information on a sub-block in which the original data is to be stored, and generating a seed according to the selected seed table. Thus, when data to be stored in a memory block including a plurality of sub-blocks are randomized, data to be stored in each sub-block is randomized independently from another sub-block. Accordingly, the randomness of the randomized data in the string direction (+Z direction) can be improved.

FIG. 11 is a block diagram illustrating seed table storage 211a in accordance with an embodiment of the present disclosure. FIGS. 12A and 12B are diagrams illustrating seed tables stored in the seed table storage 211a shown in FIG. 11.

Referring to FIG. 11, the seed table storage 211a includes a first seed table SD_TABLE1 and a second seed table SD_TABLE2. The first seed table SD_TABLE1 may be a seed table shown in FIG. 12A. The first seed table SD_TABLE1 includes seeds SD_11 to SD_1n for randomizing the pages PAGE11 to PAGE1n included in the first sub-block SUB BLOCK 1. Meanwhile, the second seed table SD_TABLE2 may be a seed table shown in FIG. 12B. The second seed table SD_TABLE2 includes seeds SD_21 to SD_2n for randomizing the pages PAGE21 to PAGE2n included in the second sub-block SUB BLOCK 2.

The seed table storage 211a receives a page address ADD_P at which data is to be stored. The page address ADD_P may include sub-block information on a sub-block in which data is to be stored and a page offset in the corresponding sub-block. The seed table storage 211a determines a seed table to be referred to in seed generation, based on the sub-block information. For example, when the sub-block information included in the page address ADD_P corresponds to the first sub-block SUB BLOCK 1, the seed table storage 211a selects the first seed table. Subsequently, the seed table storage 211a selects a seed to be output based on the page offset. For example, when the page offset included in the page address ADD_P corresponds to the page PAGE13, the seed table storage 211a selects and outputs the seed SD_13.

The first seed table and the second seed table may be set independently from each other. That is, the seeds SD_11 to SD_1n of the first seed table are set to improve the randomness of data to be stored in the first sub-block SUB BLOCK 1 in the string direction (+Z direction). Meanwhile, the seeds SD_21 to SD_2n of the second seed table are set to improve the randomness of data to be stored in the second sub-block SUB BLOCK 2 in the string direction (+Z direction).

Referring to FIGS. 12A and 12B, there is illustrated a case where the seeds SD_11 to SD_1n for randomizing the pages PAGE11 to PAGE1n included in the first sub-block SUB BLOCK 1 in the first seed table are respectively different from the seeds SD_21 to SD_2n for randomizing the pages PAGE21 to PAGE2n included in the second sub-block SUB BLOCK 2 in the second seed table.

In some embodiments, the seeds SD_11 to SD_1n for randomizing the pages PAGE11 to PAGE1n included in the first sub-block SUB BLOCK 1 in the first seed table may be respectively equal to the seeds SD_21 to SD_2n for randomizing the pages PAGE21 to PAGE2n included in the second sub-block SUB BLOCK 2 in the second seed table. The seed SD_11 may be equal to the seed SD_21, and the seed SD_12 may be equal to the seed SD_22. In this manner, the seed SD_1n may be equal to the seed SD_2n.

FIG. 13 is a table illustrating an example of a result obtained by randomizing data, using the seed tables shown in FIGS. 12A and 12B.

Referring to FIG. 13, data values of memory cells included in the cell strings CS11 and CS12 shown in FIG. 7B are illustrated. In FIG. 10, a case where each of the memory cells is a Single Level Cell (SLC) storing 1-bit data is assumed. In the example shown in FIG. 10, a case where n is "8" is illustrated. That is, each of the cell strings CS11 and CS21 includes eight memory cells. Because the memory cells are respectively coupled to the first to eighth word lines WL1 to WL8, a corresponding memory cell is designated as a word line index. For example, as a randomizing result using the first seed table, data to be stored in the memory cell MC11 coupled to the first word line WL1 among the memory cells included in the first sub-block SUB BLOCK 1 is "1." This may be a result by randomizing the page PAGE11 including the corresponding memory cell as the seed value SD_1 of the first seed table shown in FIG. 12A.

In addition, as a randomizing result using the second seed table, data to be stored in the memory cell MC21 coupled to the first word line WL1 among the memory cells included in the second sub-block SUB BLOCK 2 is "0." This may be a result by randomizing the page PAGE21 including the corresponding memory cell as the seed value SD_2 of the second seed table shown in FIG. 12B.

Meanwhile, when the randomizing result is compared for each sub-block, the cell string CS11 included in the first sub-block SUB BLOCK 1 includes a total of four bits "1," and the cell string CS21 included in the second sub-block SUB BLOCK 2 includes a total of four bits "1." Accordingly, the average value of bits of the cell string CS11 included in the first sub-block SUB BLOCK 1 is 0.5, and the average value of bits of the cell string CS21 included in the second sub-block SUB BLOCK 2 is 0.5. This is because randomizing using an independent seed table has been performed on each of the sub-blocks. Because each seed table is generated by considering the string direction (+Z direction), the randomness of data in the string direction (+Z direction) in a string included in each sub-block can be improved even when the memory block includes a plurality of sub-blocks.

Accordingly, a deviation in operating characteristic between cell strings can be decreased, and thus the operational performance can be improved.

As described above, according to the memory controller in accordance with the embodiment of the present disclosure, in randomizing of data, the memory controller randomize original data by selecting a seed table, based on sub-block information on a sub-block in which the original data is to be stored, and generating a seed according to the selected seed table. Thus, when data to be stored in a memory block including a plurality of sub-blocks is randomized, data to be stored in each sub-block is randomized independently from another sub-block. Accordingly, the randomness of the randomized data in the string direction (+Z direction) can be improved.

Figure 14:
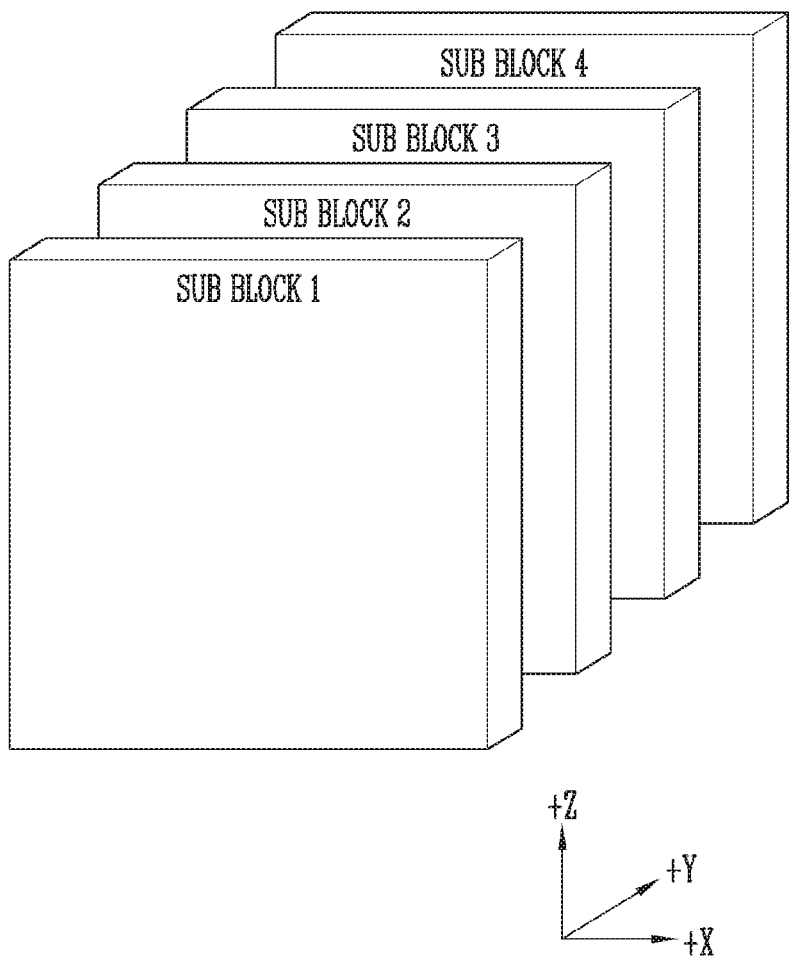
FIG. 14 is a diagram illustrating another example of sub-blocks constituting a memory block.
Figure 15:
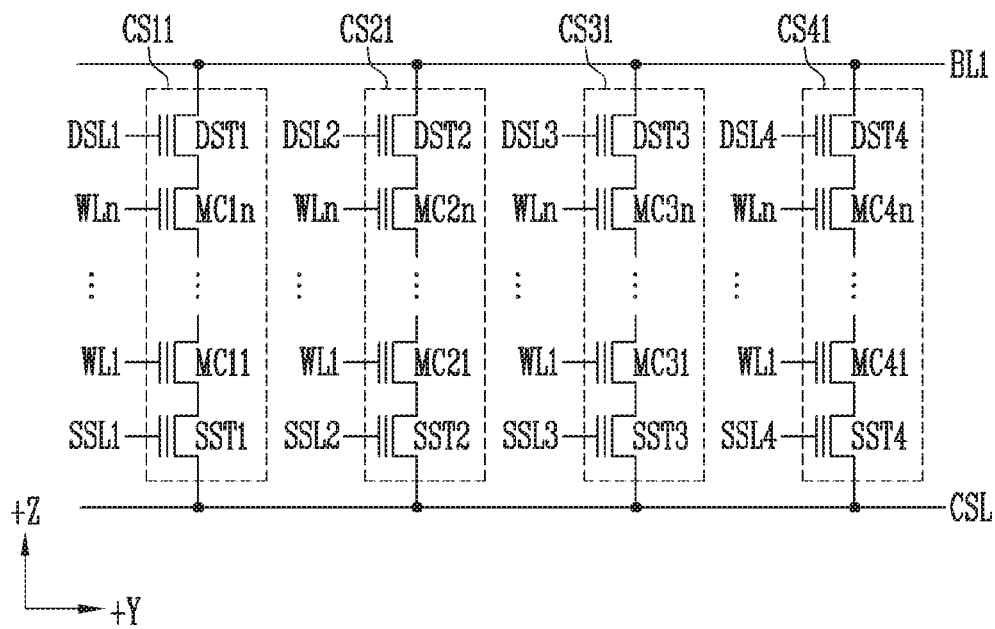
FIG. 15 is a circuit diagram illustrating some cell strings included in first to fourth sub-blocks.

FIG. 14 is a diagram illustrating another example of sub-blocks constituting a memory block. FIG. 15 is a circuit diagram illustrating some of cell strings included in first to fourth sub-blocks.

Referring to FIG. 14, a memory block may include four sub-blocks SUB BLOCK 1 to SUB BLOCK 4. As described with reference to FIG. 4, the sub-block included in the memory block may be defined as cell strings sharing a drain select line or a source select line. The memory block may be configured to include four sub-blocks as shown in FIG. 14.

Referring to FIG. 15, there are illustrated a cell string CS11 included in a first sub-block SUB BLOCK 1, a cell string CS21 included in a second sub-block SUB BLOCK 2, a cell string CS31 included in a third sub-block SUB BLOCK 3, and a cell string CS41 included in a fourth sub-block SUB BLOCK 4. FIG. 15 may be a circuit diagram illustrating the memory block shown in FIG. 14 in the +X direction.

The cell string CS11 of the first sub-block SUB BLOCK 1 includes memory cells MC11 to MC1n coupled between a first drain select transistor DST1 and a first source select transistor SST1. The cell string CS21 of the second sub-block SUB BLOCK 2 includes memory cells MC21 to MC2n coupled between a second drain select transistor DST2 and a second source select transistor SST2. The cell string CS31 of the third sub-block SUB BLOCK 3 includes memory cells MC31 to MC3n coupled between a third drain select transistor DST3 and a third source select transistor SST3. The cell string CS41 of the fourth sub-block SUB BLOCK 4 includes memory cells MC41 to MC4n coupled between a fourth drain select transistor DST4 and a fourth source select transistor SST4.

Figure 16:
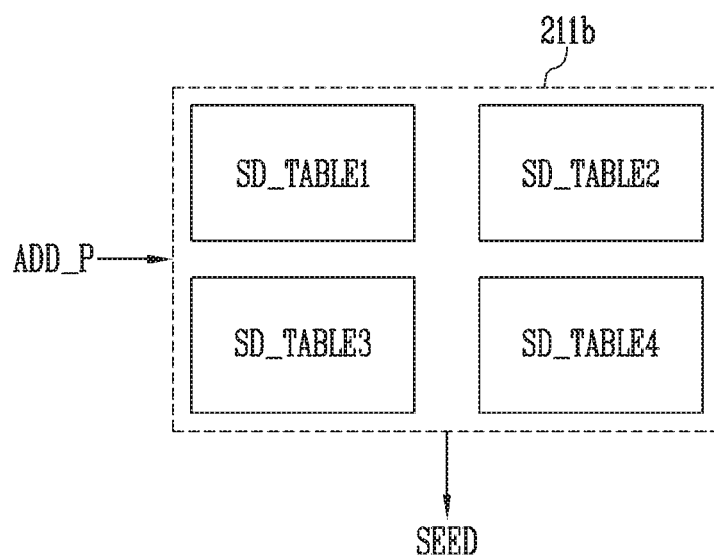
FIG. 16 is a block diagram illustrating seed table storage in accordance with another embodiment of the present disclosure.

FIG. 16 is a block diagram illustrating seed table storage 211b in accordance with another embodiment of the present disclosure.

Referring to FIG. 16, the seed table storage 211b includes a first seed table SD_TABLE1, a second seed table SD_TABLE2, a third seed table SD_TABLE3, and a fourth seed table SD_TABLE4. The first seed table SD_TABLE1 includes seeds SD_11 to SD_1n for randomizing pages PAGE11 to PAGE1n included in the first sub-block SUB BLOCK 1. The second seed table SD_TABLE2 includes seeds SD_21 to SD_2n for randomizing pages PAGE21 to PAGE2n included in the second sub-block SUB BLOCK 2. The third seed table SD_TABLE3 includes seeds SD_31 to SD_3n for randomizing pages PAGE31 to PAGE3n included in the third sub-block SUB BLOCK 3. The fourth seed table SD_TABLE4 includes seeds SD_41 to SD_4n for randomizing pages PAGE41 to PAGE4n included in the fourth sub-block SUB BLOCK 4.

As described above, the seeds SD_11 to SD_1n included in the first seed table SD_TABLE1, the seeds SD_21 to SD_2n included in the second seed table SD_TABLE2, the seeds SD_31 to SD_3n included in the third seed table SD_TABLE3, and the seeds SD_41 to SD_4n included in the fourth seed table SD_TABLE4 may be different from one another, respectively. In some embodiments, at least some of the seeds SD_11 to SD_1n included in the first seed table SD_TABLE1, the seeds SD_21 to SD_2n included in the second seed table SD_TABLE2, the seeds SD_31 to SD_3n included in the third seed table SD_TABLE3, and the seeds SD_41 to SD_4n included in the fourth seed table SD_TABLE4 may be equal to one another, respectively. In an embodiment, each of the seeds SD_11 to SD_1n included in the first seed table SD_TABLE1, each of the seeds SD_21 to SD_2n included in the second seed table SD_TABLE2, each of the seeds SD_31 to SD_3n included in the third seed table SD_TABLE3, and each of the seeds SD_41 to SD_4n included in the fourth seed table SD_TABLE4 may be equal to one another. The seed SD_11, the seed SD_21, the seed SD_31, and the seed SD_41 may be equal to one another, and the seed SD_12, the seed SD_22, the seed SD_32, and the seed SD_42 may be equal to one another. In this manner, the seed SD_1n, the seed SD_2n, the seed SD_3n, and the seed SD_4n may be equal to one another.

Figure 17:
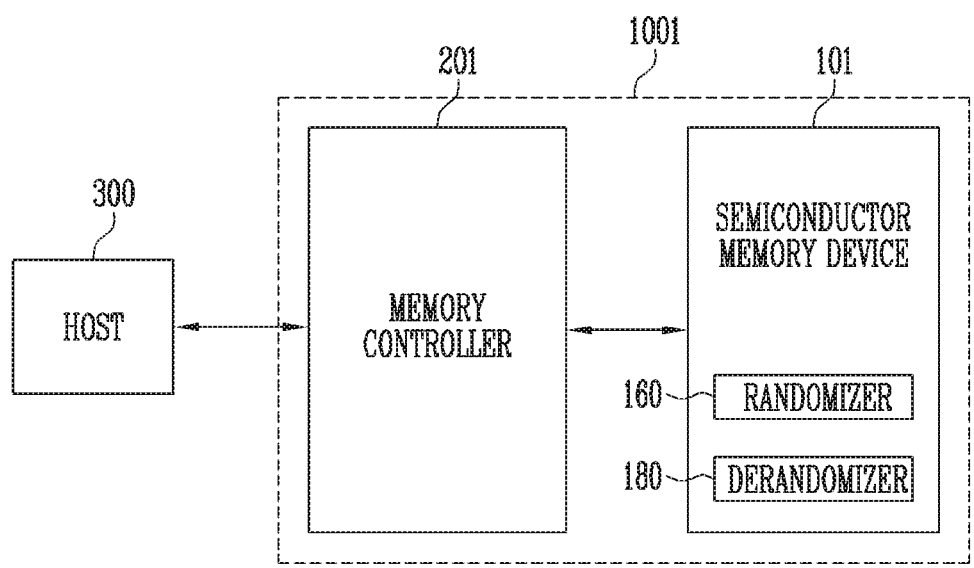
FIG. 17 is a block diagram illustrating a memory system including a memory controller and a semiconductor memory device, in accordance with another embodiment of the present disclosure.

FIG. 17 is a block diagram illustrating a memory system 1001 including a memory controller 201 and a semiconductor memory device 101 in accordance with another embodiment of the present disclosure. Referring to FIG. 17, the memory system 1001 may include the semiconductor memory device 101 and the memory controller 201.

Unlike the embodiment shown in FIG. 1, the memory controller 201 shown in FIG. 17 does not include a randomizer and does not include a derandomizer. However, the semiconductor memory device 101 includes a randomizer 160 and a derandomizer 180. The randomizer 160 may be configured identically to the randomizer 210 shown in FIG. 8A, and the derandomizer 180 may be configured identically to the derandomizer 230 shown in FIG. 8B. In an embodiment associated with FIG. 17, randomizing and derandomizing operations may be performed in the semiconductor memory device 101 instead of the memory controller 201.

Referring to FIG. 17 together with FIG. 2, when the randomizer 160 and the derandomizer 180 are included in the semiconductor memory device, the randomizer 160 and the derandomizer 180 may be configured to exchange data DATA with the read/write circuit 130. For example, data received from the memory controller 201 may be randomized by the randomizer 160 to be transferred to the read/write circuit 130. Meanwhile, data read by the read/write circuit 130 may be derandomized by the derandomizer 180 to be transferred to the memory controller 201.

Figure 18:
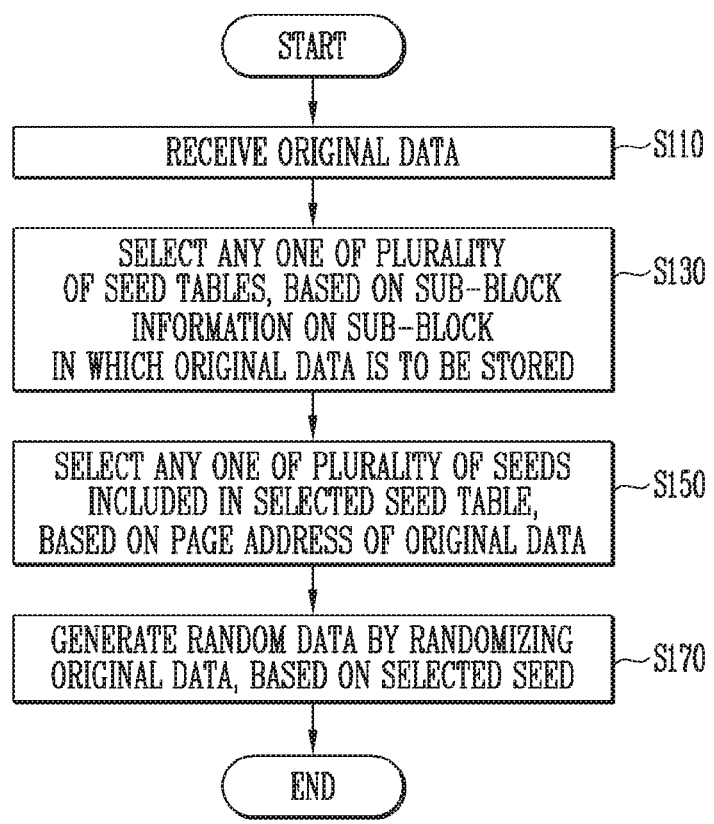
FIG. 18 is a flowchart illustrating an operating method of the randomizer in accordance with an embodiment of the present disclosure.

FIG. 18 is a flowchart illustrating an operating method of the randomizer in accordance with an embodiment of the present disclosure. The operating method shown in FIG. 18 may be performed by the randomizer 210 shown in FIG. 1 or the randomizer 160 shown in FIG. 17.

In step S110, the randomizer may receive original data. Subsequently, the randomizer selects any one of a plurality of seed tables, based on sub-block information on a sub-block in which the original data is to be stored (S130). The sub-block information may be included in the above-described page address ADD_P.

Subsequently, the randomizer selects any one of a plurality of seeds included in a selected seed table, based the page address of the original data (S150). More specifically, a seed may be selected based on the above-described page offset.

Subsequently, the randomizer generates random data by randomizing the original data, based on the selected seed (S170). In the step S170, the randomizer may generate a random sequence RND_SEQ, based on the selected seed SEED, and generate randomized data RND_DATA by performing an XOR operation on the generated random sequence RND_SEQ and the original data DATA.

Figure 19:
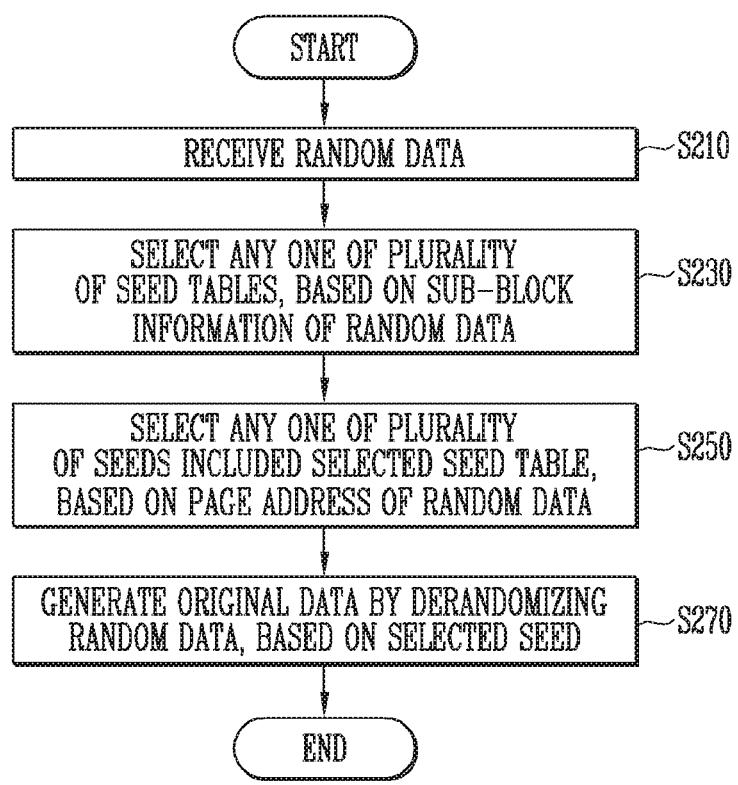
FIG. 19 is a flowchart illustrating an operating method of the derandomizer in accordance with an embodiment of the present disclosure.

FIG. 19 is a flowchart illustrating an operating method of the derandomizer in accordance with an embodiment of the present disclosure. The operating method shown in FIG. 19 may be performed by the derandomizer 230 shown in FIG. 1 or the derandomizer 180 shown in FIG. 17.

In step S210, the derandomizer may receive random data. The random data may be data read from the semiconductor memory device.

Subsequently, the derandomizer selects any one of a plurality of seed tables, based on sub-block information of the random data (S230). The sub-block information may be included in the above-described page address ADD_P.

Subsequently, the derandomizer selects any one of a plurality of seeds included in the selected seed table, based on the page address of the random data (S250). More specifically, a seed may be selected based on the above-described page offset.

Subsequently, the derandomizer generates original data by derandomizing the random data, based on the selected seed (S270). In the step S270, the derandomizer may generate a random sequence RND_SEQ, based on the selected seed SEED, and generate original data DATA by performing an XOR operation on the generated random sequence RND_SEQ and the random data RND_DATA.

Figure 20:
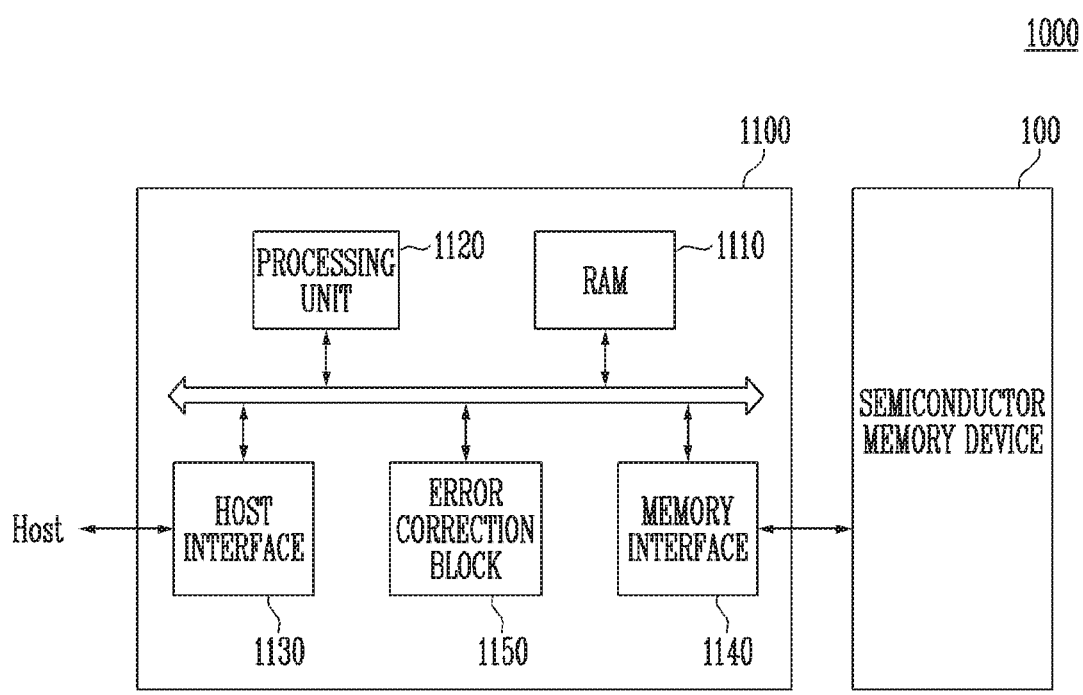
FIG. 20 is a block diagram illustrating another embodiment of the memory system shown in FIG. 1.

FIG. 20 is a block diagram illustrating another embodiment 1000 of the memory system shown in FIG. 1.

Referring to FIG. 20, the memory system 1000 includes a semiconductor memory device 100 and a memory controller 1100. The semiconductor memory device 100 may be the semiconductor memory device described with reference to FIG. 1. Alternatively, the semiconductor memory device 101 shown in FIG. 17 may be included in substitution for the semiconductor memory device 100. Hereinafter, repeated descriptions will be omitted.

The memory controller 1100 is coupled to a host Host and the semiconductor memory device 100. The memory controller 1100 may correspond to the memory controller 200 shown in FIG. 1. Alternatively, the memory controller 1100 may correspond to the memory controller 201 shown in FIG. 17.

The memory controller 1100 accesses the semiconductor memory device 100 in response to a request from the host Host. For example, the memory controller 1100 controls read, write, erase, and background operations of the semiconductor memory device 100. The memory controller 1100 provides an interface between the semiconductor memory device 100 and the host Host. The memory controller 1100 drives firmware for controlling the semiconductor memory device 100.

The memory controller 1100 includes a random access memory (RAM) 1110, a processing unit 1120, a host interface 1130, a memory interface 1140, and an error correction block 1150. The RAM 1110 is used as at least one of a working memory of the processing unit 1120, a cache memory between the semiconductor memory device 100 and the host Host, and a buffer memory between the semiconductor memory device 100 and the host Host. The processing unit 1120 controls overall operations of the memory controller 1100. In addition, the memory controller 1100 may temporarily store program data provided from the host Host in a write operation.

The host interface 1130 includes a protocol for exchanging data between the host Host and the memory controller 1100. In an embodiment, the memory controller 1100 communicates with the host Host through at least one of various interface protocols such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and a private protocol.

The memory interface 1140 interfaces with the semiconductor memory device 100. For example, the memory interface 1140 may include a NAND interface or a NOR interface.

The error correction block 1150 detects and corrects an error of data received from the semiconductor memory device 100 by using an error correction code (ECC). The processing unit 1120 may adjust a read voltage, based on an error detection result of the error correction block 1150, and control the semiconductor memory device 100 to perform re-reading. In an embodiment, the error correction block 1150 may be provided as a component of the memory controller 1100.

The memory controller 1100 and the semiconductor memory device 100 may be integrated into one semiconductor device. In an embodiment, the memory controller 1100 and the semiconductor memory device 100 may be integrated into one semiconductor device, to constitute a memory card. For example, the memory controller 1100 and the semiconductor memory device 100 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The memory controller 1100 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, then the operating speed of the host Host coupled to the memory system 1000 can be remarkably improved.

As another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory device 100 or the memory system 1000 may be packaged in various forms. For example, the semiconductor memory device 100 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIL), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 21:
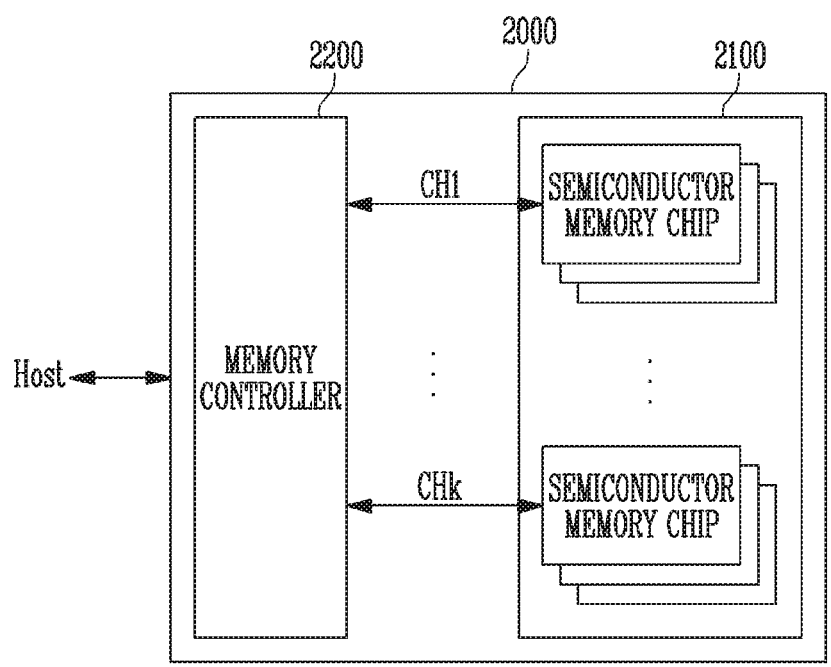
FIG. 21 is a block diagram illustrating an application example of the memory system shown in FIG. 20.

FIG. 21 is a block diagram illustrating an application example of the memory system shown in FIG. 20.

Referring to FIG. 21, a memory system 2000 includes a semiconductor memory device 2100 and a memory controller 2200. The semiconductor memory device 2100 includes a plurality of semiconductor memory chips. The plurality of semiconductor memory chips are divided into a plurality of groups.

In FIG. 21, there is illustrated a case where the plurality of groups communicate with the memory controller 2200 respectively through first to kth channels CH1 to CHk. Each semiconductor memory chip may be configured and operated identically to the semiconductor memory device 100 or 101 described with reference to FIG. 1 or 17.

Each group communicates with the memory controller 2200 through one common channel. The memory controller 2200 is configured identically to the memory controller 1100 described with reference to FIG. 20. The memory controller 2200 controls the plurality of memory chips of the semiconductor memory device 2100 through the plurality of channels CH1 to CHk.

Figure 22:
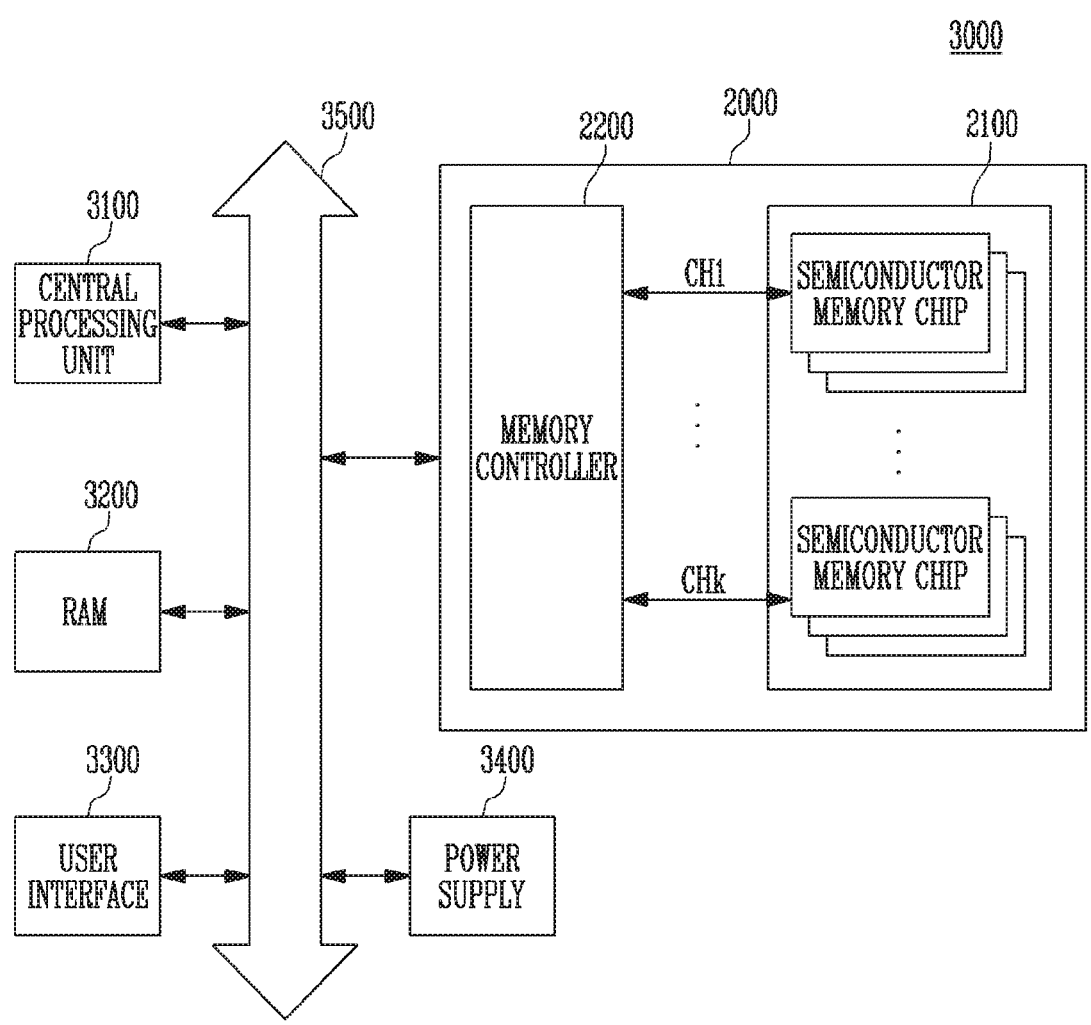
FIG. 22 is a block diagram illustrating a computing system including the memory system described with reference to FIG. 21.

FIG. 22 is a block diagram illustrating a computing system including the memory system described with reference to FIG. 21.

Referring to FIG. 22, a computing system 3000 includes a central processing unit 3100, a RAM 3200, a user interface 3300, a power supply 3400, a system bus 3500, and a memory system 2000.

The memory system 2000 is electrically coupled to the central processing unit 3100, the RAM 3200, the user interface 3300, and the power supply 3400 through the system bus 3500. Data supplied through user interface 3300 or data processed by the central processing unit 3100 are stored in the memory system 2000.

In FIG. 22, there is illustrated a case where the semiconductor memory device 2100 is coupled to the system bus 3500 through the memory controller 2200. However, the semiconductor memory device 2100 may be directly coupled to the system bus 3500. The function of the memory controller 2200 may be performed by the central processing unit 3100 and the RAM 3200.

In FIG. 22, there is illustrated a case where the memory system 2000 described with reference to FIG. 21 is provided. However, the memory system 2000 may be replaced by the memory system 1000 described with reference to FIG. 20. In an embodiment, the computing system 3000 may include both of the memory systems 1000 and 2000 described with reference to FIGS. 20 and 21.

In accordance with the present disclosure, a semiconductor memory device and a memory controller having a randomizer are capable of improving the randomness of data.

While the present disclosure has been shown and described with reference to certain embodiments thereof, it will be understood by those skilled in the art that various changes in form and detail may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or some of the steps and may be omitted. In each embodiment, the steps are not necessarily performed in accordance with the described order and may be rearranged. The embodiments disclosed in this specification and drawings serve only as examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory controller for controlling an operation of a semiconductor memory device including a memory block including a plurality of sub-blocks, the memory controller comprising a randomizer,
    wherein the randomizer includes:
    seed table storage configured to store a plurality of seed tables respectively corresponding to the plurality of sub-blocks, select a seed table corresponding to a sub-block in which received original data is to be stored from among the plurality of seed tables, and to generate a seed according to the selected seed table;
    a random sequence generator configured to generate a random sequence, based on the seed generated according to the selected seed table; and
    an operating component configured to generate random data, based on the random sequence and the original data.

2. The memory controller of claim 1, wherein the sub-block comprises a set of cell strings sharing a drain select line or a source select line in the memory block.

3. The memory controller of claim 1, wherein the seed table storage is configured to receive a page address representing a position at which the original data is to be stored, and to select any one of the plurality of seed tables, based on sub-block information included in the page address.

4. The memory controller of claim 3, wherein the seed table storage is configured to select and output any one of seeds included in the selected seed table, based on a page offset included in the page address.

5. The memory controller of claim 1, wherein the random sequence generator is configured as any one of a linear feedback shift register, a Pseudo-Noise (PN) random sequence generator, and a Cyclic Redundancy Check (CRC) generator.

6. The memory controller of claim 1, wherein the operating component is configured to generate the random data by performing an exclusive-OR (XOR) operation on the random sequence and the original data.

7. The memory controller of claim 1, further comprising a derandomizer configured to receive random data from the semiconductor memory device, and to derandomize the received random data.

8. The memory controller of claim 7, wherein the derandomizer is configured to generate a seed, based on sub-block information of the random data, and to derandomize the random data, based on the generated seed.

9. A semiconductor memory device comprising:
    a memory block including a plurality of sub-blocks;
    a read/write circuit configured to perform a read operation and a write operation of data on the memory block;
    a randomizer configured to receive original data, and to randomize the received data and then transfer the randomized data to the read/write circuit,
    wherein the randomizer includes:
    seed table storage configured to store a plurality of seed tables respectively corresponding to the plurality of sub-blocks, to select a seed table corresponding to a sub-block in which the original data is to be stored from among the plurality of seed tables, and to generate a seed according to the selected seed table;
    a random sequence generator configured to generate a random sequence, based on the seed generated according to the selected seed table; and
    an operating component configured to generate random data, based on the random sequence and the original data.

10. The semiconductor memory device of claim 9, wherein the sub-block comprises a set of cell strings sharing a drain select line or a source select line in the memory block.

11. The semiconductor memory device of claim 9, wherein the seed table storage is configured to receive a page address representing a position at which the original data is to be stored, and to select any one of the plurality of seed tables, based on sub-block information included in the page address.

12. The semiconductor memory device of claim 11, wherein the seed table storage is configured to select and output any one of seeds included in the selected seed table, based on a page offset included in the page address.

13. The semiconductor memory device of claim 9, wherein the random sequence generator is configured as any one of a linear feedback shift register, a Pseudo-Noise (PN) random sequence generator, and a Cyclic Redundancy Check (CRC) generator.

14. The semiconductor memory device of claim 9, wherein the operating component is configured to generate the random data by performing an exclusive-OR (XOR) operation on the random sequence and the original data.

15. The semiconductor memory device of claim 9, further comprising a derandomizer configured to receive random data from the read/write circuit, and to derandomize the received random data.

16. A method for randomizing data to be stored in a memory block including a plurality of sub-blocks, the method comprising:
    receiving original data;
    selecting a seed table corresponding to a sub-block in which the original data is to be stored from among a plurality of seed tables, corresponding to the plurality of sub-blocks;
    selecting any one of a plurality of seeds included in the selected seed table, based on a page address of the original data; and
    generating random data by randomizing the original data, based on the selected seed.

17. The method of claim 16, wherein receiving the original data comprises receiving a page address corresponding to the original data, and wherein selecting the seed table from among the plurality of seed tables comprises selecting the seed table corresponding to sub-block information included in the page address.

18. The method of claim 17, wherein selecting the any one of the plurality of seeds included in the selected seed table comprises selecting any one of the seeds included in the selected seed table based on a page offset included in the page address.

19. The method of claim 16, wherein generating the random data by randomizing the original data, based on the selected seed, comprises:
   generating a random sequence based on the selected seed; and
   generating the random data by performing an exclusive-OR (XOR) operation on the random sequence and the original data.

20. The method of claim 16, wherein the sub-block comprises a set of cell strings sharing a drain select line or a source select line in the memory block.

* * * * *